(12) United States Patent
Sakui

(10) Patent No.: US 7,061,786 B2
(45) Date of Patent: *Jun. 13, 2006

(54) SEMICONDUCTOR MEMORY DEVICE AND MEMORY SYSTEM

(75) Inventor: Koji Sakui, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/042,200

(22) Filed: Jan. 26, 2005

(65) Prior Publication Data

US 2005/0128808 A1   Jun. 16, 2005

Related U.S. Application Data

(63) Continuation of application No. 10/775,068, filed on Feb. 11, 2004, now Pat. No. 6,859,379, which is a continuation of application No. 10/457,416, filed on Jun. 10, 2003, now Pat. No. 6,741,486, which is a continuation of application No. 10/078,009, filed on Feb. 20, 2002, now Pat. No. 6,594,169.

(30) Foreign Application Priority Data

Feb. 21, 2001   (JP) .............................. 2001-045330

(51) Int. Cl.
  *G11C 7/00*   (2006.01)
(52) U.S. Cl. .......................................... 365/63; 365/51
(58) Field of Classification Search .................. 365/63, 365/51, 230.03
  See application file for complete search history.

(56) References Cited

U.S. PATENT DOCUMENTS

| | | |
|---|---|---|
| 5,734,621 A | 3/1998 | Ito |
| 5,742,101 A | 4/1998 | Sakuta et al. |
| 5,793,774 A | 8/1998 | Usui et al. |
| 6,278,616 B1 | 8/2001 | Gelsomini et al. |
| 6,288,958 B1 | 9/2001 | Suzuki |
| 6,404,043 B1 * | 6/2002 | Isaak .......................... 257/686 |
| 6,411,561 B1 * | 6/2002 | Ayukawa et al. ...... 365/230.03 |
| 6,414,384 B1 * | 7/2002 | Lo et al. ...................... 257/685 |
| 6,434,034 B1 | 8/2002 | Wallace et al. |
| 6,462,421 B1 * | 10/2002 | Hsu et al. ................... 257/777 |

OTHER PUBLICATIONS

Yoshihisa Iwata, et al. "A 35 ns Cycle Time 3.3 V Only 32 Mb NAND Flash EEPROM," IEEE Journal of Solid-State Circuits, vol. 30, No. 11, Nov. 1995, pp. 1157-1164.

Toru Tanzawa, et al. "A Compact On-Chip ECC for Low Cost Flash Memories," IEEE Journal of Solid-State Circuits, vol. 32, No. 5, May 1997, pp., 662-669.

Hitoshi Kume, et al. "A 1.28 µm² Contactless Memory Cell Technology for a 3V-Only 64Mbit EEPROM," IEDM Technology Digest, Dec. 1992, 92 pp., 991-993.

(Continued)

*Primary Examiner*—Vu A. Le
(74) *Attorney, Agent, or Firm*—Oblon, Spivak, McClelland, Maier & Neustadt, P.C.

(57) ABSTRACT

The present invention provides a semiconductor memory device and memory system comprising a first semiconductor memory having a first peripheral circuit for transmitting and receiving memory data to/from a first memory cell array, a second semiconductor memory having a second peripheral circuit for transmitting and receiving the memory data to/from a second memory cell array, and a part of the peripheral circuit of the first semiconductor memory formed adjacent to the second memory cell array by a design rule of the second peripheral circuit.

22 Claims, 2 Drawing Sheets

OTHER PUBLICATIONS

Hitoshi Miwa, et al. "A 140mm² 64Mb and Flash Memory with a 0.4 μm Technology," IEEE International Solid-State Circuits Conference, ISSCC Digest of Technical Papers, Feb. 1996, pp., 34-35.

H. Onoda, et al. "A Novel Cell Structure Suitable for a 3. Volt Operation, Sector Erase Flash Memory," IEDM Technology Digest, Dec. 1992, pp. 599-602.

S. Kobayashi, et al. "A 3.3 V-Only 16Mb Dinor Flash Memory," ISSCC Digest of Technical Papers, Feb. 1995, pp., 122-123.

F. Masuoka, et al. A New Flash E² PROM Cell Using Triple Polysilicon Technology: IEDM Technology Papers, Feb. 1987, pp. 76-77.

Georgha Samachisa, et al. "A 128k Flash EEPROM Using Double Polysilicon Technology" ISSCC Digest of Technical Papers, 1987, pp. 76-77.

Virgil Niles Kynett, et al. "An In-System Reprogrammable 256K CMOS Flash Memory," IEEE International Solid-State Circuits Conference, Digest of Technical Papers, 1998, pp. 132-133.

Fujio Masuoka, et al. "New Ultra High Density EPROM and Flash EEPROM with NAND Structure Cell," IEDM 1987, pp., 552-555.

Jin-ki Kim, et al. "A 120-mm² 64 Mb NAND Flash Memory Archieving 180 ns/Byte Effective Program Speed," IEEE Journal of Solid-State Circuits, vol. 32, No. 5, May 1997, pp. 670-680.

Masataka Kato, et al. "A 0.4 μm² Self-Aligned Contactlessmemory Cell Trchnology Suitable for 256-Mbit Flash Memories," IEDM Technology Digest, 1994, pp. 921-923.

Shin-ichi Kobayashi, et al. "Memory Array Architecture and Decording Scheme for 3 V Only Sector Erasable Dinor Flash Memory," IEEE Journal of Solid-State Circuits, vol. 29, No., 4, Apr. 1994, pp. 454-460.

* cited by examiner

SEMICONDUCTOR MEMORY DEVICE AND MEMORY SYSTEM

CROSS-REFERENCE TO RELATED APPLICATIONS

This application is based upon and claims the benefit of priority from the prior Japanese Patent Application No. 2001-045330, filed Feb. 21, 2001, the entire contents of which are incorporated herein by reference.

BACKGROUND OF THE INVENTION

1. Field of the Invention

The present invention relates to a semiconductor memory device and a memory system, and more particularly, it relates to a semiconductor memory device and a memory system using an electrically rewritable and non-volatile semiconductor memory in combination with an electrically rewritable and volatile semiconductor memory.

2. Description of the Related Art

Conventionally, there is known an EEPROM (Electrically Erasable and Programmable Read Only Memory) as one of the semiconductor memories. Special attention has been paid to a NAND-type flash memory using a plurality of memory cells connected in series to constitute a NAND cell block, as memory capable of high integration.

For the NAND-type flash memory, see the following references: F. Masuoka et al., "New ultra high density EPROM and flash EEPROM with NAND structured cell", IEDM Tech. Dig., pp. 552–555, December 1987; J. K. Kim et al., "A 120 mm² 64 Nb NAND flash memory achieving 180 ns/Byte effective program speed", IEEE J. Solid-State Circuits, vol. 32, no. 5, pp. 670–680, May 1997.

A memory cell transistor constituting the NAND-type flash memory has an MOS transistor structure in which a floating gate (charge accumulation layer) and a control gate are stacked one on the other via an insulation film on a semiconductor substrate. A plurality of the memory cell transistors are arranged adjacent to each other and connected in series so as to share a source and a drain, thereby constituting a NAND-type cell. Such NAND cells are arranged in matrix like layout to thereby constitute a memory cell array of the NAND-type flash memory.

The NAND-type cells arranged in the column direction of the memory cell array have one end composed of memory cell transistors having drains each connected via a select gate transistor to a common bit line, and the other end composed of memory cell transistors having sources each connected via a select gate transistor to a common source line. Control gates of the memory cell transistors and select gates of the select gate transistors are connected in the row direction of the cell array as a word line (control gate line) and a select gate line, respectively.

The NAND-type flash memory having the aforementioned configuration has advantages that the cell size per one bit is small and the rewrite speed is high as compared to a NOR-type flash memory. On the other hand, the NAND-type flash memory has a disadvantage that access time in random access is 25 μs which is 2 orders or more slower than the NOR-type flash memory whose access time is 100 ns.

For the NOR-type flash memory, see the following references: F. Masuoka et al., "A new flash E²PROM cell using triple polysilicon technology", IEDM Tech. Dig., pp. 464–467, December 1984; G. Samachisa et al., "A 128K flash EEPROM using double polysilicon technology", ISSCC Dig. Tech. Papers, pp. 76–77, February 1987; V. N. Kynett et al., "An in-system reprogrammable 256K CMOS flash memory", ISSCC Dig. Tech. Papers, pp. 132–133, February 1988.

Moreover, in the NAND-type flash memory, 512-byte data items are read out all at once as page data into a page buffer and accordingly, it is recommended to perform error check correction (hereinafter, referred to as ECC) from an external system out of the chip. Moreover, there is a disadvantage that 16-byte redundant bits per page should be provided on the chip.

Accordingly, to constitute a semiconductor memory device and memory system using the NAND-type flash memory in combination with an SRAM (Static Random Access Memory), a part of a peripheral circuit of the NAND-type flash memory including an ECC circuit and a control circuit of the NAND flash memory and an interface circuit interfacing with the high speed SRAM should be provided as a separate chip.

Especially with the mobile telephone and PDA (Personal Digital Assistant) market becoming larger and larger every year in all the world, the flash memory used for mobile telephones and PDAs should significantly increase its capacity. Demand for the NAND-type flash memory is increasing because its bit cost is cheap compared to that of the NOR-type flash memory.

However, as has been described above, when a part of the peripheral circuit of the NAND-type flash memory including the ECC circuit and the control circuit dedicated to the NAND-type flash memory and interface circuit for the high-speed SRAM is provided on a separate chip, this not only increases a production cost but also causes a large obstacle when trying to reduce the size of the mobile telephone and the like.

Ideally speaking, it is preferable that all the peripheral circuits of a memory chip be implemented on a single memory chip. However, the NAND-type flash memory requires voltage as high as about 20V for memory data rewriting, and for designing a high-voltage transistor, a large design rule is applied to the peripheral circuit.

For this, in the semiconductor memory device and memory system using the NAND-type flash memory in combination with the high-speed SRAM, an overhead area as a redundant area arises in layout when all the peripheral circuits of the NAND-type flash memory are formed on the chip of the NAND-type flash memory.

Moreover, as has been described above, the memory cell transistor of the NAND-type flash memory has a two-layered gate structure in which a floating gate and a control gate are stacked one on the other. Here, if a MOS transistor having an ordinary one-layered gate structure is used to constitute a peripheral circuit of the cell array, separate steps are required for forming the cell array and the peripheral circuit, which increases the production cost.

For this, conventionally, in the NAND-type flash memory production procedure, all the MOS transistors including the peripheral circuit are formed to have the two-layered gate structure and in the MOS transistors constituting the peripheral circuit, the floating gate and the control gate are connected to each other and pulled out onto a wiring layer, so as to obtain substantially a one-gate structure.

However, a large area is required for a contact portion for connecting the floating gate and the control gate and pulling them out onto the wiring layer. Accordingly, if this method is used for all the MOS transistors required for the peripheral circuit structure, it becomes difficult to reduce the occupation area of the peripheral circuit.

Especially, in the semiconductor memory device and memory system using the NAND-type flash memory in combination with the high-speed SRAM, if all the peripheral circuits related to the NAND-type flash memory including not only a peripheral circuit for operation of the NAND-type flash memory but also the ECC circuit, the control circuit of the NAND-type flash memory, and the interface circuit for interfacing between the NAND-type flash memory and the high-speed SRAM are formed on the chip of the NAND-type flash memory, the chip size becomes excessively large.

For this, in spite of causing a large size and a high cost of the mobile telephone and the like, in the semiconductor memory device and memory system using the NAND-type flash memory in combination with the high-speed SRAM, a widely used design method is such that a part of the peripheral circuit dedicated to the NAND-type flash memory is implemented on a separate chip.

It is therefore an aspect of the present invention to provide a semiconductor memory device and memory system using a non-volatile semiconductor memory consisting of a NAND-type flash memory and the like in combination with a volatile semiconductor memory consisting of a high-speed SRAM in which a part of the peripheral circuit dedicated to the NAND-type flash memory is not formed on a separate chip but provided on the high-speed SRAM, thereby reducing the size of the mobile telephone and the like.

BRIEF SUMMARY OF THE INVENTION

In the semiconductor memory device and memory system according to the present invention using a NAND-type flash memory in combination with a high-speed SRAM for a mobile telephone, a memory card, and the like, peripheral circuits dedicated to the NAND-type flash memory such as an ECC circuit, a control circuit, and an interface circuit are partially built into the SRAM chip.

More specifically, the semiconductor memory device and memory system according to the present invention comprise: a first semiconductor memory having a first peripheral circuit for transmitting and receiving memory data to/from a first memory cell array; a second semiconductor memory having a second peripheral circuit for transmitting and receiving the memory data to/from a second memory cell array; and a part of a control circuit of the first semiconductor memory formed adjacent to the second memory cell array according to a design rule of the second peripheral circuit.

DETAILED DESCRIPTION OF THE INVENTION

Description will now be directed to embodiments of the present invention with reference to the attached drawings.

EMBODIMENT 1

Figure 1:
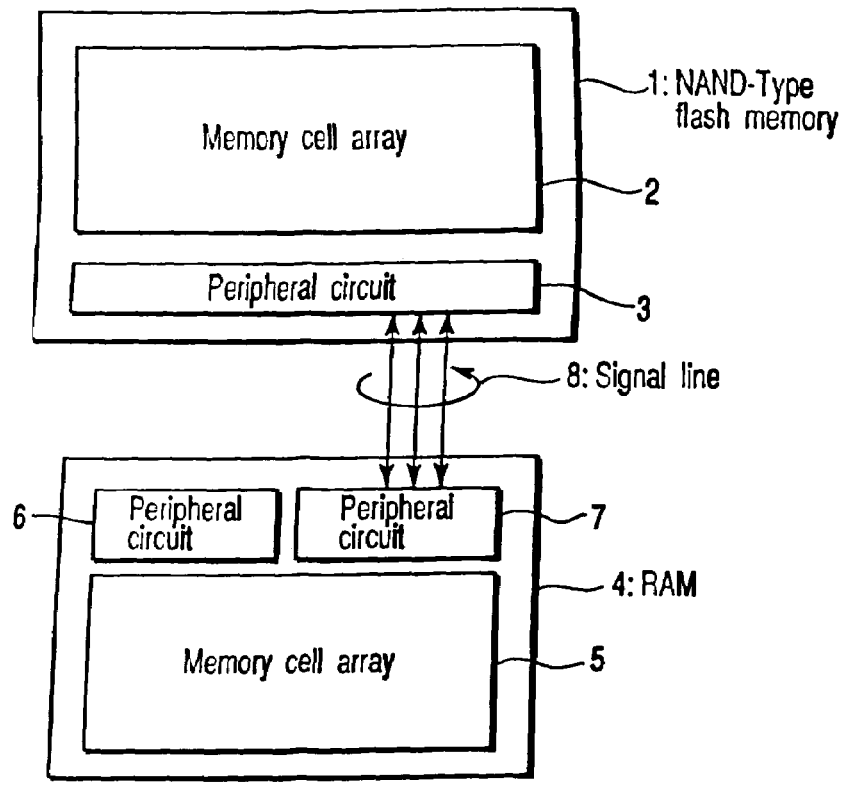
FIG. 1 shows a basic configuration of a semiconductor memory device and memory system according to a first embodiment.

FIG. 1 shows a semiconductor memory device and memory system according to a first embodiment of the present invention.

The semiconductor memory device and memory system according to the first embodiment comprises: a non-volatile NAND-type flash memory 1; a volatile RAM 4, and a signal line 8 connecting the NAND-type flash memory 1 to the RAM 5. Here, the NAND-type flash memory 1 is formed on a first semiconductor chip and the RAM 4 is formed on a second semiconductor chip. Moreover, as the RAM 4, for example, a high-speed SRAM is preferably used. It is also possible to use DRAM (Dynamic Random Access Memory) and a pseudo-SRAM.

The first and second semiconductor chips may be stacked one on the other and sealed or molded into a single package, or it is also possible to seal or mold the first and second semiconductor chips in different packages, which are combined when assembled.

Moreover, the first and second semiconductor chips may be arranged side by side or stacked one on the other on a circuit substrate or may be mounted on different circuit substrates. The first and second semiconductor chips sealed or molded in one package are preferably used as a component of the semiconductor memory device or memory system. The first and second semiconductor chips mounted on a single circuit substrate are preferably used as a semiconductor memory system.

The NAND-type flash memory 1 is composed of a memory cell array 2 and a peripheral circuit 3 required for transmitting and receiving memory data to/from the memory cell array 2. This peripheral circuit 3 comprises a control circuit for operating the NAND-type flash memory; a voltage boost circuit for generating a write voltage, read voltage, and erase voltage; a page buffer circuit for reading and writing the memory data from/to a memory cell; a column decoder; a row decoder; and the like.

Furthermore, the RAM 4 comprises a memory cell array 5; a peripheral circuit 6 for transmitting and receiving the memory data to/from the memory cell array 5; and a part of peripheral circuit (peripheral circuit 7 in FIG. 1) dedicated to the NAND-type flash memory 1. The peripheral circuit 7 comprises an ECC circuit of the NAND-type flash memory 1; an interface circuit for interfacing between the NAND-type flash memory 1 and the RAM 4; and a part of the control circuit for operating the NAND-type flash memory 1.

In the NAND-type flash memory, a flag is set (flag is written into a non-volatile memory) in a redundant portion of a failed block in the memory cell array and this flag is read out when power is turned on, so that data access is not performed to the failed block. This control is also included as a part of the control circuit for operating the NAND-type flash memory 1.

Additionally, when this memory system is used as a memory card, a control circuit dedicated to the card is required. Moreover, in case of a silicon disc to replace a hard disc, a control circuit dedicated to the silicon disc is required. These control circuits are also built in the RAM chip used in combination with the NAND-type flash memory. Moreover, the NAND-type flash memory 1 and the RAM 4 are connected to each other using a signal line 8. The signal line 8 includes a control signal line, an address line, I/O line, and the like.

As has been described above, in the semiconductor memory device and memory system according to the first embodiment, only the circuit indispensable for transmitting and receiving data to/from the memory cell array is mounted on the peripheral circuit 3 of the NAND-type flash memory 1 while a part of the peripheral circuit dedicated to the NAND-type flash memory 1 required for constituting the memory system using the NAND-type flash memory 1 and the RAM 4 as components is formed in the peripheral circuit 7 on the chip of RAM 4.

This configuration eliminates the necessity of a large-size transistor such as a voltage boost circuit on the chip of the RAM 4. Accordingly, by designing the peripheral circuit 7 by using a design rule similar to a peripheral circuit 6 of the RAM 4, it is possible to shrink the overhead area in the layout.

Moreover, since there is no need of process matching with the NAND-type flash memory 1 (the two-layered gate structure), it is possible to use a MOS transistor of single-layered gate structure with a high integration density on the chip of the RAM 4 without arranging the peripheral circuit 7 on a separate chip.

It should be noted that the first embodiment has been explained for a case that the NAND-type flash memory and the RAM are formed as different chips, so as to serve as components of the semiconductor memory device and memory system at the stage of multi-chip assembling. However, the present invention is not limited to the multi-chip assembly.

Even when the NAND-type flash memory and the RAM are formed on a single chip, a layout advantage can be obtained as a whole by forming a part of the peripheral circuit dedicated to the NAND-type flash memory adjacent to the RAM cell array using the design rule of the RAM peripheral circuit and forming only the peripheral circuit indispensable for data transmitting and receiving to/from the NAND cell array in the NAND-type flash memory layout region.

EMBODIMENT 2

Next, explanation will be given on a second embodiment with reference to FIG. 2.

In the semiconductor memory device and memory system according to the second embodiment, the chip of the NAND-type flash memory and the chip of the RAM are stacked one on the other and sealed or molded into a single package so as to constitute a multi-chip-package (hereinafter, referred to as MCP).

Figure 2:
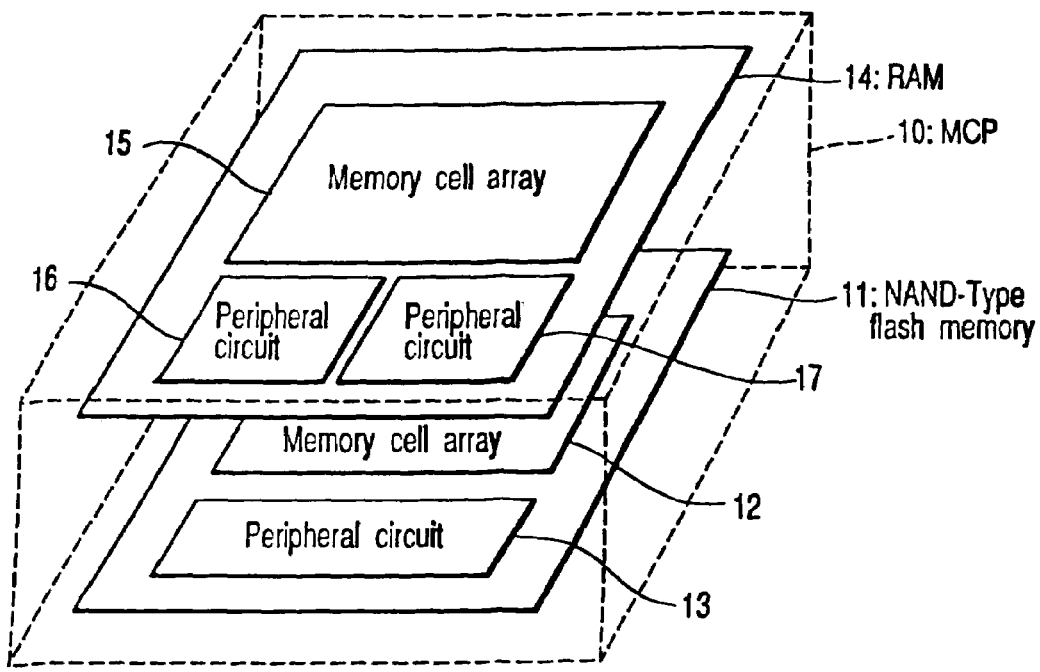
FIG. 2 shows a semiconductor memory device and memory system as a stacked assembly on MCP according to a second embodiment.

FIG. 2 shows the MCP composed of the NAND-type flash memory and the RAM according to the second embodiment. In the MCP 10, the NAND-type flash memory 11 and the RAM 14 are separate chips stacked within a single package.

On the chip of the NAND-type flash memory 11, there are formed a memory cell array 12 and a peripheral circuit 13 for transmitting and receiving memory information to/from the memory cell array 12 while on the chip of the RAM 14, there are formed a memory cell array 15, a peripheral circuit 16 for transmitting and receiving memory information to/from the memory cell array 15, and a part of peripheral circuit dedicated to the NAND-type flash memory 11 (peripheral circuit 17).

It should be noted that in FIG. 2, a wiring connecting the NAND-type flash memory 11 to the RAM 14, a signal line, and external terminals of the MCP are omitted.

When the MCP is composed of two chips, i.e., the chip of the NAND-type flash memory and the chip of the RAM are stacked one on the other, it is possible to significantly reduce the MCP assembly area. Moreover, by matching the arrangement of pads between the two chips, it is possible to reduce length of the wiring connecting the two chips and length of the signal line, thereby enhancing the integration density and operation speed of the semiconductor memory device and memory system composed of the MCP.

EMBODIMENT 3

Next, explanation will be given on a third embodiment with reference to FIG. 3.

In the third embodiment, explanation will be given on configuration of a memory card in which the NAND-type flash memory chip and the RAM chip are arranged side by side and sealed or molded in a single package.

Figure 3:
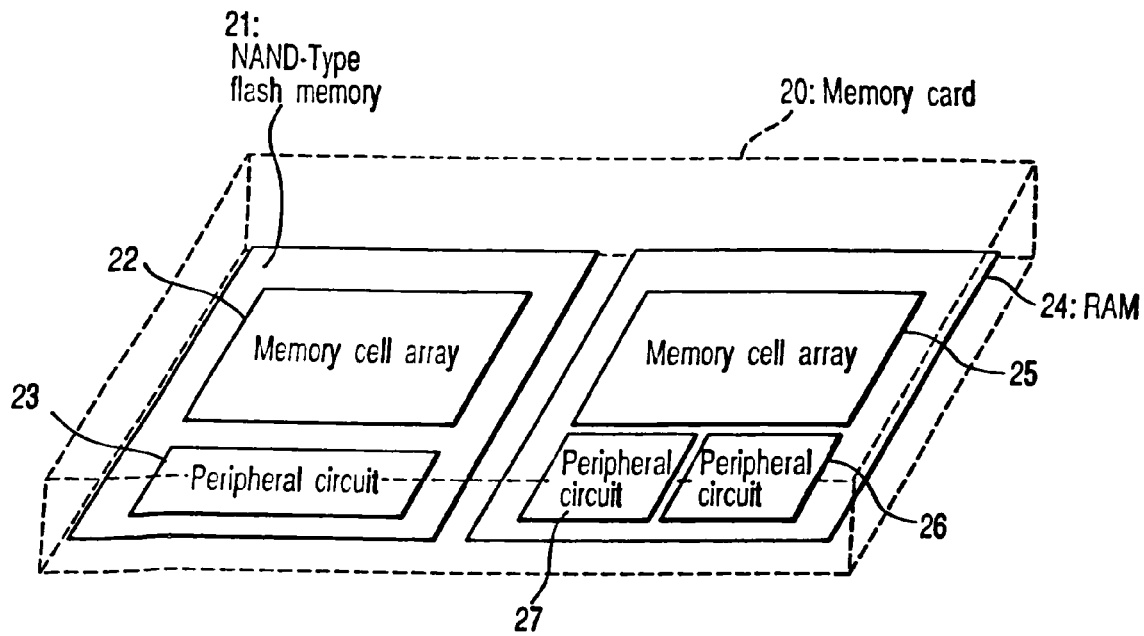
FIG. 3 shows a memory card configuration assembled side by side according to a third embodiment.

FIG. 3 shows configuration of the memory card composed of the NAND-type flash memory and the RAM according to the third embodiment.

In the memory card 20, two chips, i.e., a chip of the NAND-type flash memory 21 and a chip of the RAM 24 are arranged side by side. On the chip of the NAND-type flash memory 21, there are formed a memory cell array 22 and a peripheral circuit 23 for transmitting and receiving memory information to/from the memory cell array 22 while on the chip of the RAM 24, there are formed a memory cell array 25, a peripheral circuit 26 for transmitting and receiving memory information to/from the memory cell array 25, and a part of a peripheral circuit dedicated to the NAND-type flash memory 21 (peripheral circuit 27).

The peripheral circuit 27 may include in addition to the part of the peripheral circuit dedicated to the NAND-type flash memory 21, a control circuit of the memory card itself. The control circuit of the memory card itself varies depending on the card type: a compact flash card (CF card), a secure digital card (SD card), a memory stick card, a multi media card (MMC card), and the like. It should be noted that in the figure, a wiring connecting the NAND-type flash memory 21 to the RAM 24, a signal line, external terminals of the memory card are omitted.

Thus, when the two chips, i.e., the NAND-type flash memory chip and the RAM chip are arranged side by side, it is possible to sufficiently reduce thickness of the MCP so as to serve as a memory card. It should be noted that by using a layout that the peripheral circuit and control circuit are arranged to face each other between the two chips and matching the pad arrangement, it is possible to reduce the length of the wiring connecting the two chips and the length of a signal line, which in turn increases the memory card integration density and operation speed.

EMBODIMENT 4

Next, explanation will be given on a fourth embodiment with reference to FIG. 4.

As the fourth embodiment, explanation will be given on a memory card in which two chips of NAND-type flash memory are stacked one on the other, which are arranged at a side of the RAM chip to be used in combination, and the three chips are sealed or molded in a single package.

Figure 4:
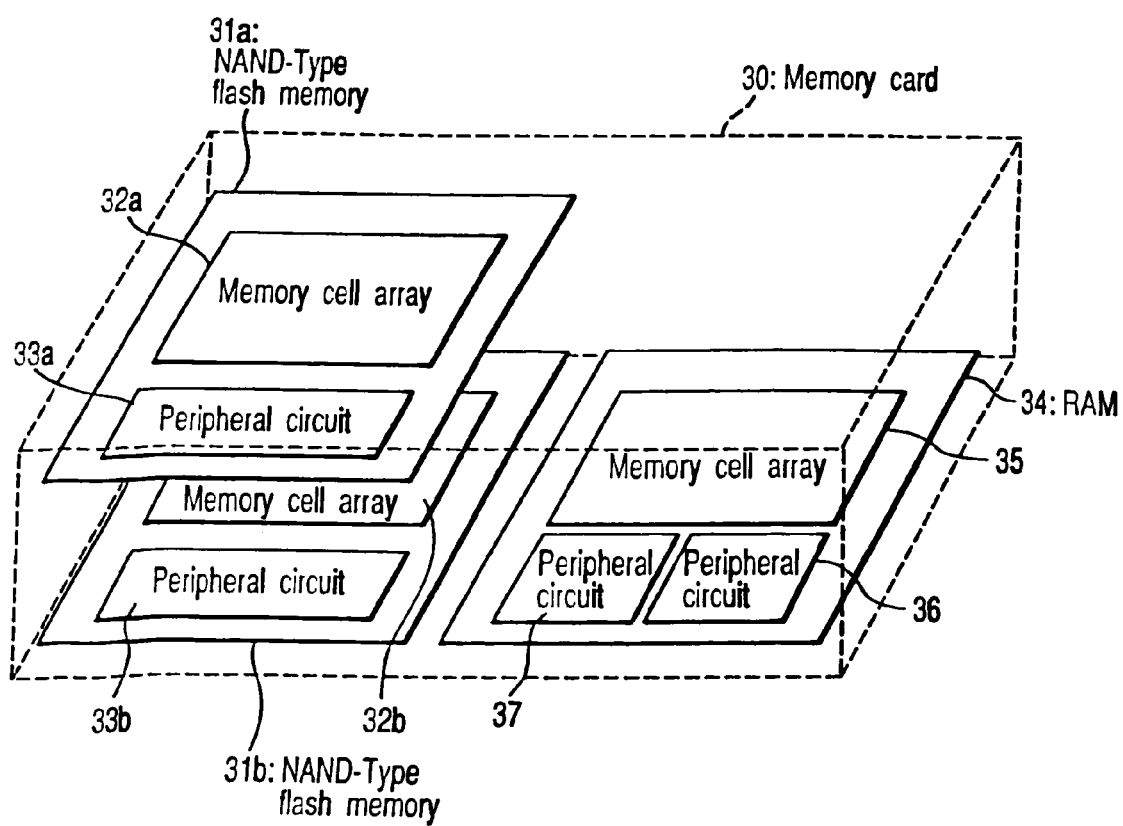
FIG. 4 shows a memory card configuration assembled mixed-stacked and side by side according to a fourth embodiment.

As shown in FIG. 4, the memory card according to the fourth embodiment includes NAND-type flash memories 31a and 31b composed of two chips and one chip of a RAM 34 having a part of peripheral circuit of the NAND-type flash memories 31a and 31b as a built-in circuit (peripheral circuit 37). The NAND-type flash memory chips and the RAM chip have identical configuration as in the first to third embodiment and identical components are denoted by corresponding reference numbers, omitting their detailed explanation.

Thus, when the two chips of the NAND-type flash memories are stacked one on the other and one RAM chip is arranged at a side of the two chips so as to constitute the MCP, it is possible to significantly increase the memory capacity of the NAND-type flash memory to be combined with the RAM while using a chip occupation area identical to that of the third embodiment.

As has been explained in the second and the third embodiment, by matching the chip arrangement with the pad arrangement on the chips, it is possible to reduce the length of wiring connecting chips and the length of a signal line, thereby increasing the integration density and operation speed of the semiconductor memory device and memory system.

It should be noted that in the fourth embodiment, explanation has been given on an example combining two chips of the NAND-type flash memories with the one-chip RAM. However, the second to the fourth embodiment include a case when n (n is a natural number) chips of the NAND-type flash memories are combined with m (m is a natural number not greater than n) chips of the RAM.

EMBODIMENT 5

Next, explanation will be given on a fifth embodiment of the present invention. In the fifth embodiment, chip size comparison is performed between a case when a part of the peripheral circuit dedicated to the NAND-type flash memory explained in the first to fourth embodiment is built into the NAND-type flash memory chip and a case when the part of the peripheral circuit is built into the RAM chip.

It should be noted that, here, explanation will be given on a case when a pseudo-SRAM is used as the RAM.

When the design rule is 0.13 µm, a 1-giga bit NAND-type flash memory has a chip size calculated to be about 130 mm$^2$. When this chip has a built-in part of the peripheral circuit dedicated to the NAND-type flash memory, the chip size increases by about 25 mm$^2$.

In contrast to this, when a pseudo-SRAM chip of design rule of 0.13 µm has the built-in part of the peripheral circuit dedicated to the NAND-type flash memory, the chip size increases only by 2 mm$^2$. The entire chip size of the pseudo-SRAM varies depending on the memory capacity, but the increased portion does not reach 10% of the chip size.

Thus, there is a great difference in chip size increase between the NAND-type flash memory and the pseudo-SRAM because in the case of the NAND-type flash memory, the design rule of 0.13 µm is a design rule of the memory cell array and a design rule of the peripheral circuit is multiplied by about 10 because of the reason explained in the prior art.

As has been described above, by building the part of the peripheral circuit dedicated to the NAND-type flash memory in the RAM chip to be combined with, it is possible to significantly reduce the overhead area, thereby enabling to provide a semiconductor memory device and memory system having a high integration density at a low cost. As a result, it is possible to provide a new product such as a mobile telephone and PDA having a smaller size and a smaller weight at a low cost.

In the fifth embodiment, the chip size increase has been calculated for the pseudo-SRAM chip having a large memory capacity as the RAM chip to be combined with the NAND-type flash memory. Identical results can be obtained when a high-speed SRAM or DRAM chip is used as the RAM chip.

It should be noted that the present invention is not to be limited to the aforementioned embodiments. For example, in the first to the fifth embodiment, the NAND-type flash memory having a large memory capacity as a non-volatile semiconductor memory to be combined with the RAM chip made from volatile memory cells may be replaced by other types of flash memory.

The semiconductor memory device and its system according to the present invention can also be constituted by using a non-volatile memory chip such an AND-type, NOR-type, or DINOR-type flash memory in combination with the RAM chip made from volatile memory cells. For the AND-type, or DINOR-type flash memory, see the following citations.

AND-type; H. Kume et al, "A 1.28 µm$^2$ contactless memory cell technology for 3V only 64 Mbit EEPROM", IEDM Tech. Dig., pp. 991–993, December 1992; H. Miwa et al., "A 140 mm$^2$ 64 Mb AND flash memory with a 0.4 µm technology", ISSCC Dig. Tech. Papers, pp. 34–35, February 1996.

DINOR-type; H. Onoda et al., "A novel cell structure suitable for a 3 volt operation, sector erase flash memory", IEDM Tech. Dig., pp. 599–602, December 1992; S. Kobayashi et al., "A 3.3V only 16 Mb DINOR flash memory", ISSCC Dig. Tech. Papers, pp. 122–123, February 1995.

For example, when the present invention is applied to a combination of the NOR-type flash memory chip with the high-speed SRAM chip, it is possible to provide a semiconductor device and memory system having a high speed, low power consumption, and a high integration density although the memory capacity is small.

Moreover, when a plurality of NAND-type flash memory chips are used in combination with a pseudo-SRAM chip having a built-in part of the peripheral circuit dedicated to the NAND-type flash memories, it is possible to obtain a remarkably large memory capacity, although power consumption is increased. This combination can preferably be used for a system other than the memory card such as a silicon disc and the like.

It should be noted that when the present invention is applied, a part of the peripheral circuit dedicated to the non-volatile semiconductor memory should be built into a volatile semiconductor memory chip. A control circuit contained in a part of the peripheral circuit differs depending on a subject system and accordingly, the semiconductor memory device and memory system of the present invention cannot be constituted by using a general purpose volatile RAM chip as it is.

However, the control circuit contained in a part of the peripheral circuit required for application of the present invention is small in circuit size and it is possible to easily provide a chip corresponding to the system without increase of cost due to design modification by applying the CAD, or the like. Especially in the field of mobile telephones or memory cards, a production amount is quite large per one type and even if a chip is developed corresponding to the system, there is no danger of disadvantage caused by multi-type small-amount production.

It should be noted that the semiconductor memory device and memory system of the present invention have been explained on a case when a non-volatile semi-conductor memory is used in combination with a volatile semiconductor memory, but the present invention is not limited to such a case.

For example, there is a case that integration density is increased by using a first and a second semiconductor memory which are both volatile semiconductor memories formed on different chips and forming a part of peripheral circuit dedicated to the first semiconductor memory on the second semiconductor memory. Thus, the present invention can be modified in various ways without departing from the scope of the present invention.

As has been described above, according to the present invention, a part of the peripheral circuit dedicated to the non-volatile semiconductor memory is formed not on a separate chip but on the volatile semiconductor memory chip used in combination, thereby enabling to provide the semiconductor memory device and memory system capable of reducing size of a mobile telephone, a memory card, and the like with a high integration density at a low cost. Moreover, when the combination of the non-volatile semiconductor memory chip and the volatile semiconductor memory chip is mounted on the MCP, it is possible to achieve a further cheaper and smaller semiconductor memory device and memory system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A memory card comprising:
    a first chip comprising a nonvolatile memory cell having a plurality of first memory cells and a first portion of a first peripheral circuit dedicated to the plurality of first memory cells; and
    a second chip electrically connected to the first chip and comprising a plurality of second memory cells, a second portion of the first peripheral circuit, and a second peripheral circuit, wherein
    said second portion of the first peripheral circuit is designed by using a design rule similar to the second peripheral circuit of the plurality of second memory cells.

2. The memory card according to claim 1, wherein the plurality of second memory cells comprise:
    a random access memory.

3. The memory card according to claim 1, wherein the second portion of the first peripheral circuit comprises:
    an error detection/correction circuit.

4. The memory card according to claim 1, wherein the second portion of the first peripheral circuit comprises:
    an interface circuit.

5. The memory card according to claim 1, wherein the second portion of the first peripheral circuit comprises:
    a part of a control circuit configured to control said plurality of first memory cells.

6. The memory card according to claim 1, wherein the first chip further comprises:
    a voltage boost circuit for the plurality of first memory cells.

7. The memory card according to claim 1, wherein the second portion of the first peripheral circuit comprises:
    a circuit configured to read a flag identifying an error in said plurality of first memory cells.

8. The memory card according to claim 1, wherein one of said plurality of first memory cells comprises:
    a two-layered gate structure including a control gate and a floating gate; and
    a MOS transistor having one-layered gate structure.

9. The memory card according to claim 1, wherein the plurality of first memory cells comprise:
    a NAND structure shared by source/drain regions of adjacent transistors.

10. The memory card according to claim 1, wherein the random access memory comprises one of:
    an SRAM,
    a pseudo-SRAM, and
    a DRAM.

11. The memory card according to claim 1, wherein the nonvolatile memory cell comprises one of:
    a NAND-type flash memory,
    an AND-type flash memory,
    a DINOR-type flash memory, and
    a NOR-type flash memory.

12. The memory card according to claim 1, wherein the first chip is arranged in parallel with the second chip.

13. The memory card according to claim 1, wherein the first chip and the second chip are stacked on each other.

14. A memory card comprising:
    a first chip comprising a nonvolatile memory cell having a plurality of first memory cells and a first portion of a peripheral circuit dedicated to the plurality of first memory cells; and
    a second chip electrically connected to the first chip and arranged above said first chip, said second chip comprising a plurality of second memory cells and a second portion of the peripheral circuit.

15. The memory card according to claim 14, wherein the plurality of second memory cells comprise:
    a random access memory.

16. The memory card according to claim 14, wherein the plurality of first memory cells comprise:
    a NAND structure shared by source/drain regions of adjacent transistors.

17. A memory card comprising:
    a plurality of first chips stacking one on another, each of the plurality of first chips comprising a nonvolatile memory cell having a plurality of first memory cells and a first portion of the peripheral circuit dedicated to the plurality of first memory cells; and
    a second chip electrically connected to the plurality of first chips and arranged at side of the plurality of first chips, said second chip comprising a plurality of second memory cells and a second portion of the peripheral circuit.

18. The memory card according to claim 17, wherein the plurality of second memory cells comprise:
    a random access memory.

19. The memory card according to claim 17, wherein the plurality of first memory cells comprise:
    a NAND structure shared by source/drain regions of adjacent transistors.

20. The memory card according to claim 17, wherein the nonvolatile memory cell comprises one of:
    a NAND-type flash memory,
    an AND-type flash memory,
    a DINOR-type flash memory, and
    a NOR-type flash memory.

21. A memory card comprising:
    a first chip comprising a nonvolatile memory cell having a plurality of first memory cells and first peripheral circuit dedicated to the plurality of memory cells; and a second chip electrically connected to the first chip and arranged above said first chip, said second chip comprising a plurality of second memory cells and a plurality of second peripheral circuits, one of the second peripheral circuits constituting a part of the first peripheral circuit.

22. A memory card comprising:

a plurality of first chips stacking one on another, each of the plurality of first chips comprising a nonvolatile memory cell having a plurality of first memory cells; and a second chip electrically connected to the plurality of first chips and arranged at side of the plurality of first chips, said second chip comprising a plurality of second memory cells, wherein each of the plurality of first chips includes a first portion of a peripheral circuit dedicated to the plurality of first memory cells; and the second chip includes a second portion of the peripheral circuit.

* * * * *